(12) United States Patent
Pischl

(10) Patent No.: US 6,414,561 B1
(45) Date of Patent: Jul. 2, 2002

(54) CONNECTOR IMBALANCE COMPENSATION APPARATUS AND METHOD

(75) Inventor: Neven Pischl, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/991,486

(22) Filed: Nov. 21, 2001

Related U.S. Application Data

(63) Continuation of application No. 09/465,434, filed on Dec. 20, 1999, now abandoned.

(51) Int. Cl.$^7$ .................................................. H04B 3/32
(52) U.S. Cl. ......................................... 333/12; 333/260
(58) Field of Search ............................. 174/261, 70 R; 527/778; 439/76.1; 333/12, 260

(56) References Cited

U.S. PATENT DOCUMENTS

| | | | |
|---|---|---|---|
| 5,628,653 A | 5/1997 | Haas et al. | 439/607 |
| 5,647,765 A | 7/1997 | Haas et al. | 439/609 |
| 5,735,712 A | 4/1998 | Haas et al. | 439/609 |

*Primary Examiner*—Robert Pascal
*Assistant Examiner*—Dean Takaoka
(74) *Attorney, Agent, or Firm*—Skjerven Morrill LLP; Samuel G. Campbell, III

(57) ABSTRACT

A conductive area or layer of a circuit board is aligned with, and spaced from, a portion of a first differential signal conductor pair and connected through a conductive pathway to one of the conductors of a second differential signal conductor pair to provide capacitive coupling for compensating an imbalance arising from non-symmetric pin assignments. By compensating the imbalance, signal quality and/or immunity is improved and noise and/or emission is reduced.

15 Claims, 3 Drawing Sheets

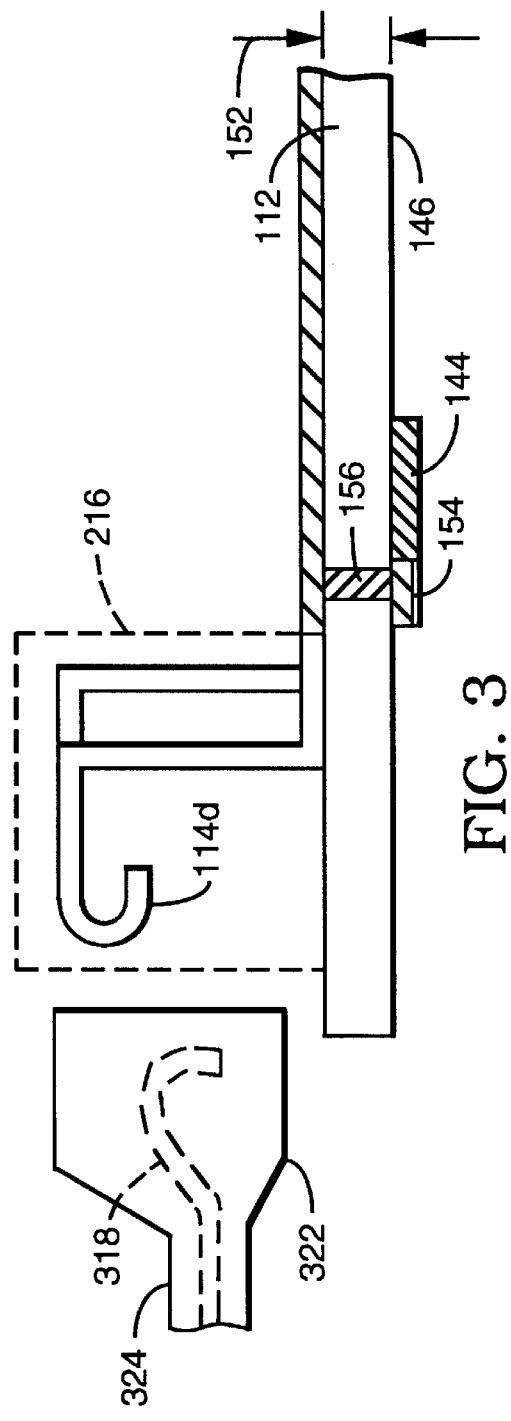
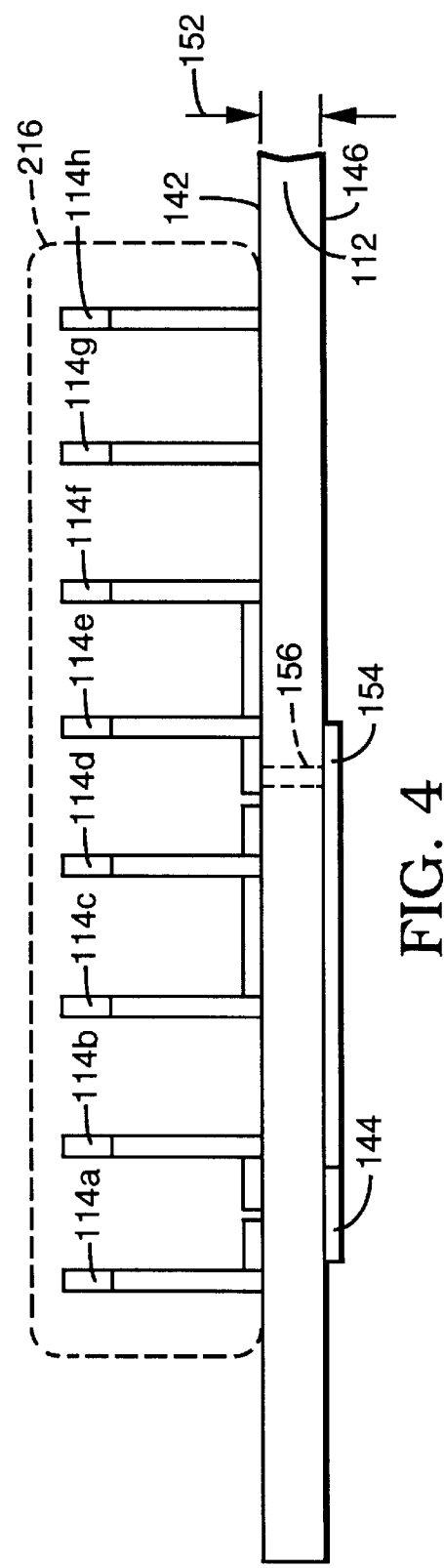

CONNECTOR IMBALANCE COMPENSATION APPARATUS AND METHOD

This application is a continuation of U.S. patent application Ser. No. 09/465,434, filed Dec. 20, 1999, now abandoned.

The present invention relates to compensation of imbalances among differential signals and in particular to a method and apparatus for providing compensated capacitance when the geometry of differential signal lines creates imbalance.

BACKGROUND INFORMATION

Whenever signals are conveyed from one electronic component to another over a physical medium such as a cable, there is a need to achieve at least some level of signal accuracy or integrity. For example, a certain level of signal accuracy or integrity is desirable for conveying signals from one network component, such as a first Ethernet node (e.g. an Ethernet hub or source) over a network cable to a second Ethernet node. Those of skill in the art will understand the need for a certain level of signal accuracy or integrity in other systems such as other networks, and any other variety of other digital and/or analog communication systems.

One aspect of communicated signals which is desirably maintained or enhanced is signal quality and/or relatively low levels of noise. In some situations, crosstalk noise is of particular concern. Accordingly, it would be useful to provide an apparatus, system and method which can make it feasible to enhance or maintain relatively high signal quality and/or reduce crosstalk or other noise.

Another potential problem with signal transmission is the level of immunity. In particular, some communication devices or system may be susceptible to interference from various external sources such as electrostatic discharge, radio broadcast signals and the like. Accordingly it would be useful to provide a signal communication apparatus, system and method which can enhance or maintain immunity, e.g., immunity to external sources such as electrostatic discharge, broadcast signals and the like.

In addition to concerns with signal quality, in many circumstances it is also desirable to reduce or avoid electromagnetic radiation from electronic components and/or cables. Accordingly, it would be useful to provide an apparatus system and method which can reduce or avoid the amount of emission from cables or electronic components.

In general, communication apparatus and systems are relatively cost-sensitive. For example, fabrication costs can include not only direct cost of obtaining and assembling components but also less-direct costs such as costs associated with occupying board space or volume (or other space or volume). Accordingly, it would be useful to provide an apparatus, system or method that can assist in achieving high signal quality and/or immunity at relatively low costs of design, fabrication, installation, maintenance and repair and/or operation.

SUMMARY OF THE INVENTION

The present invention includes a recognition of the existence and/or nature of certain problems, including as described herein. Although the present invention can be used in the context of a variety of different communication apparatus and systems, as one example, it has been found that a standard RJ-45 connector, e.g., for use in the context of an Ethernet network or communication system, can have an undesirably high degradation of signal quality or immunity. Without wishing to be bound by any theory, it is believed that at least some degradation of signal It quality or immunity is related to the non-symmetric pin locations in the RJ-45 connector used for the two wire pairs carrying differential signals, and thus creating a imbalance. Although, at least theoretically, signal degradation may be related to imbalances in any of a variety of electrical or electronic parameters (such as capacitance, inductance, or other parameters) without wishing to be bound by any theory, it is believed that at least some, and likely the greater part of, signal degradation in the context of systems such as Ethernet RJ-45 connections are associated with, or arise from, imbalances in capacitance of one or both conductors of a first differential pair with respect to a second differential pair. It is believed that imbalances can make such systems vulnerable to crosstalk or other noise and/or can lead to degradation of immunity to external noise sources.

Although it might be effective, in avoiding such noise problems, to use a different and more symmetric pin assignment scheme, it is believed this approach is substantially infeasible because of the large installed base of components using standard RJ-45 Ethernet (or other standard) pin assignment schemes.

It further would be possible to reduce or avoid at least some signal degradation potential by reconfiguring the cables, or the connectors by which cables are connected to circuit boards or other components. For example, wires or other signal carrying components in a connector or cable may be bent or moved (with respect to the configuration of traditional or standard cables or connectors) so as to modify capacitance or other electric or electronic parameters. However, in at least some embodiments of the present invention an approach involving modifying or reconfiguring cables or connectors is not preferred. Such an approach would place a burden on users to select and use such modified cables or connectors. Moreover, if a compensating cable or connector were used in conjunction with a compensating circuit board approach (e.g., as described below) the resultant overcompensation could increase noise levels.

According to one aspect of the invention, a circuit board is provided which achieves an amount of capacitive coupling between at least one conductor of a first differential signal pair (i.e. a pair of printed wires or traces used to convey a differential signal) and a second differential pair. Preferably the capacitive coupling is achieved without the need to use or mount discrete capacitors on the circuit board (which, it is believed, would undesirably increase fabrication or other costs). In one embodiment, a substantially conductive area or region is formed in or on the circuit board, aligned with, but spaced from, a portion of the second differential pair, with a conductive lead providing a conductive pathway from the region or area to at least one conductor of the first differential pair. In one embodiment, the conductive area or region and the second differential pair are formed on opposite surfaces of the circuit board such that the full thickness of the circuit board acts as a dielectric between the region or area and the second differential pair. In another embodiment, one or both of the portion of the differential pair and the conductive region or area are formed as internal layers in the circuit board, such that only a portion of the circuit board thickness acts as a dielectric. Preferably, the amount of capacitive coupling between the first conductor of the first differential pair and the second differential pair is sufficient to fully or partially compensate for the difference between the capacitive coupling (i.e., the capacitive coupling that would exist in the absence of the compensation)

between the first conductor of the first pair (with respect to the second pair) and the second conductor of the first pair (with respect to the second pair).

In one aspect, a conductive area or layer of a circuit board is aligned with, and spaced from, a portion of a first differential signal conductor pair and connected through a conductive pathway to one of the conductors of a second differential signal conductor pair to provide capacitive coupling for compensating an imbalance arising from non-symmetric pin assignments. By compensating the imbalance, signal quality and/or immunity is improved and noise and/or emission is reduced.

BRIEF DESCRIPTION OF THE DRAWINGS

FIG. 3 is a cross-section taken along line 3—3 of FIG. 2; and

FIG. 4 is a front elevational view of the circuit board of FIG. 2.

DETAILED DESCRIPTION OF THE PREFERRED EMBODIMENT

Figure 1:
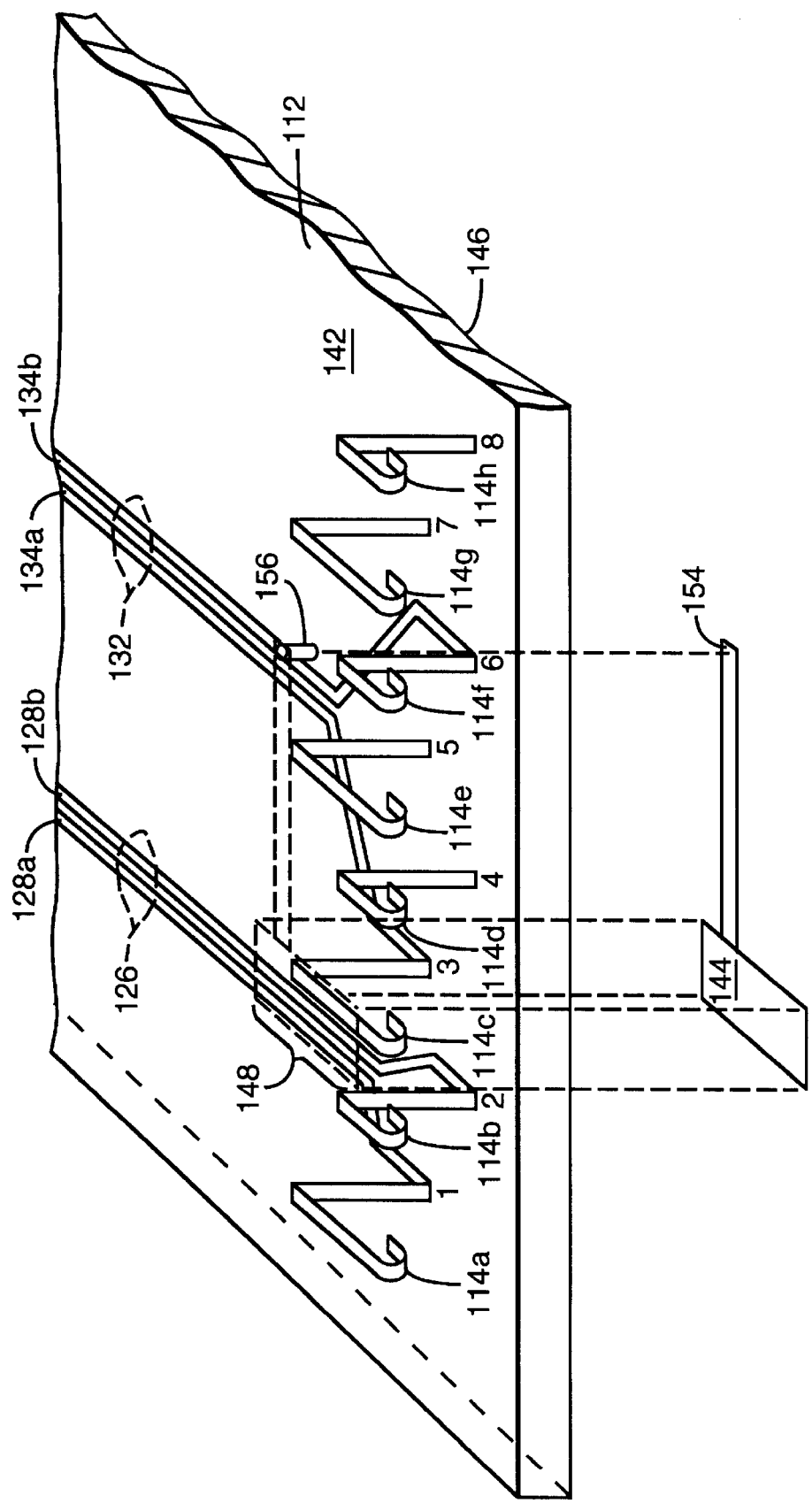
FIG. 1 is a perspective view, partially exploded and partially broken away of a circuit board and coupler according to one embodiment of the present invention.
Figure 2:
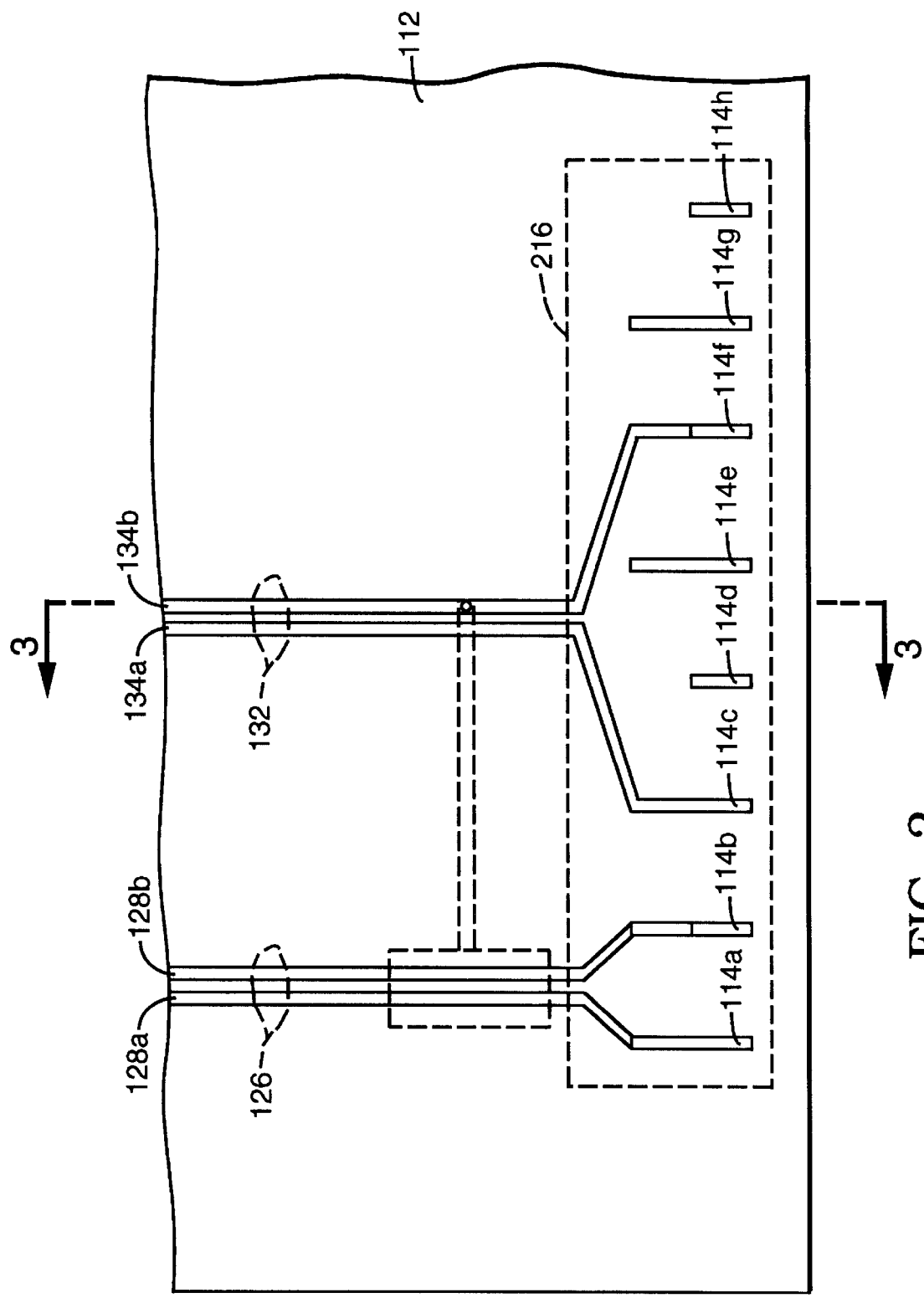
FIG. 2 is a top plan view of the circuit board of FIG. 1.

In the embodiment depicted in FIG. 1, a circuit board 112 is provided with a connector having 8 pins or sockets 114a–114h. Typically the pins 114a–h are positioned in a connector housing (depicted generically, in phantom 216 in FIGS. 2–4), and configured to connect with corresponding pins or sockets 318 in a connector end 322 of a cable 324 (FIG. 3). Thicknesses of printed circuit components, in FIGS. 3 and 4, are exaggerated for clarity. In the depicted embodiment, a first differential pair 126 of first and second leads or wires 128a 128b are respectively connected to pins 1 and 2 114a 114b. A second differential pair 132 having first and second leads 134a 134b are connected, respectively to pins 3 and 6, 114c, 114f.

For purposes of the present description, the capacitance between pins m and n would designated $C_{mn}$. Thus, the capacitance between pin 1 and pin 6 is designated $C_{16}$. The capacitance between pin P and the pair of pins m and n (together) will be designated $C_{p,\,m\,\&\,n}$.

Due to the differential nature of the signals, the total capacitance between, for example, pin 3 and pins 1 and 2 (together) is $C_{3,\,1\,\&\,2}=|C_{23}-C_{13}|$. Similarly, the total capacitance between pin 6 and pair 1 and 2 (together) is $C_{6,\,1\&2}=|C_{16}-C_{26}|$. Because of the physical arrangement of the pins as depicted, the capacitance from pin 3 to the pins 1 and 2 (together) is larger than capacitance from pin 6 to the pins 1 and 2 (together), i.e. $C_{3,\,1\&2}>C_{6,\,1\&2}$.

The difference between these two capacitances is provides a net capacitance, i.e., an imbalance, which is believed to contribute to loss of signal quality (e.g., noise) and/or loss of signal immunity.

According to one embodiment, the capacitive coupling from pin 6 114f to the differential pair is increased to compensate for the imbalance and provide better quality of signal and less emission (noise) from the cables. It is anticipated that the net capacitance is on the order of a few pF. Nevertheless, because the differential signals are usually large in amplitude (several volts) significant common-mode noise amplitude can result, e.g., due to conversion.

In the depicted embodiment, to increase the capacitive coupling between pin 6 114f and the differential pair 126, a capacitor, preferably built on or out of the PCB material, preferably during board layout, is provided. In the depicted embodiment, while the differential pair 126 is formed on the upper surface 142 (in the view of FIG. 1) of the PCB 112, a substantially conductive area or region 144 (e.g., a layer of copper or other conductive material) is formed on the lower surface 146 of the PCB, substantially aligned with a portion 148 of the differential pair 126 but spaced therefrom by the thickness 152 of the PCB 112. In the depicted embodiment a substantially conductive pathway is provided between the conductive region or area 144 and the trace 134 connected to pin 6 114f formed from a trace or printed wire 154 and a via or through-hole 156, filled with conductive material.

In light of the above description a number of advantages of the present invention can be seen. The present invention provides a manner for increasing signal quality and/or immunity, decreasing noise and/or emission and otherwise providing signal communication with relatively high accuracy and integrity, particularly with respect to systems having two or more differential signal pairs. The present invention can provide such advantages at relatively low costs of design, fabrication, operation, maintenance and repair. The present invention can provide such advantages without requiring users to obtain, select or use special, modified, reconfigured or non-standard cables. The present invention can achieve better quality of signals passing through connectors, including RJ-45 and other connectors, that carry differential signals. The present invention can achieve less emission and, accordingly, can assist in achieving compliance with EMC standards (electromagnetic emission and immunity compliance). The present invention can provide improved immunity of network and other components.

A number of variations and modifications of the invention can be used. It is possible to use some features of the invention without using others. For example, although it may not be the most cost-effective approach, it is possible to provide capacitive coupling to compensate imbalance in differential signals arising from non-symmetric pin assignments without forming a capacitor directly on a circuit board surface or interior layer, such as by using one or more discrete capacitors. Although the present invention has been described in the context of an example of an RJ-45 connector used for an Ethernet system, the present invention can also be used in connection with other types of connectors and/or systems, as will be clear to those of skill in the art after understanding the present disclosure. It is possible to vary a number of different factors to achieve the desired amount of capacitive coupling, including varying the size or conductivity of the conductive area or region 144, varying the dielectric constant of the circuit board or other spacing material, and/or varying the distance between the conductive area or region 144 and the aligned differential pair 126.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and/or reducing cost of implementation. The present invention includes items which are novel, and terminology adapted from previous and/or analogous technologies, for convenience in describing novel items or processes, do not necessarily retain all aspects of conventional usage of such terminology.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. Apparatus useable for compensating an imbalance between a first differential pair which includes first and second conductors for carrying a first differential signal pair and a second differential pair which includes third and fourth conductors for carrying a second differential signal pair, comprising:
    a circuit board formed of a first circuit board material, defining first and second major surfaces, said circuit board having a first thickness;
    a first substantially conductive area formed on said second major surface of said circuit board substantially aligned with and spaced from a first portion of said second differential pair, said first substantially conductive area being spaced from said second differential pair by a predetermined thickness of said first circuit board material, and spaced laterally a predetermined distance from said first differential pair on said first major surface; and
    a substantially conductive pathway from said first substantially conductive area to said first conductor configured to increase capacitive coupling between said first conductor and said second differential pair.

2. Apparatus, as claimed in claim 1, wherein at least one of said first substantially conductive area and said third and fourth conductors are formed as an interior layer of said circuit board.

3. Apparatus, as claimed in claim 1, wherein said conductive pathway includes at least a first via through at least a portion of the thickness of said circuit board.

4. Apparatus, as claimed in claim 1, wherein said first, second, third and fourth conductors are connected to pins of a cable coupler.

5. Apparatus, as claimed in claim 4, wherein said cable coupler is an RJ-45 coupler.

6. A method for compensating an imbalance between a first differential pair which includes first and second conductors for carrying a first differential signal pair and a second differential pair which includes third and fourth conductors for carrying a second differential signal pair, the method comprising:
    providing a circuit board formed of a first circuit board material defining first and second major surfaces, said circuit board having a first thickness;
    forming a first substantially conductive area on said second major surface of said circuit board substantially aligned with and spaced from a first portion of said second differential pair, said substantially conductive area being spaced from said second differential pair by a predetermined thickness of circuit board material;
    forming said first differential pair on said first major surface spaced laterally a predetermined distance from said first substantially conductive area; and
    forming a substantially conductive pathway from said first substantially conductive area to said first conductor configured to increase capacitive coupling between said first conductor and said second differential pair.

7. A method as claimed in claim 6 further comprising forming at least one of said first substantially conductive area and said third and fourth conductors as an interior layer of said circuit board.

8. A method as claimed in claim 6 further comprising forming a conductive via through at least a portion of said thickness of said circuit board to provide at least a part of said conductive pathway.

9. A method as claimed in claim 6 further comprising coupling said first, second, third and fourth conductors to pins of a cable coupler.

10. A method as claimed in claim 9 further comprising providing an RJ-45 coupler as said cable coupler.

11. Apparatus usable for compensating an imbalance between a first differential pair which includes first and second conductors for carrying a first differential signal pair and a second differential pair which includes third and fourth conductors for carrying a second differential signal pair, comprising:
    first means for supporting circuitry components, said first means comprising first and second major surfaces, said first means having a first thickness;
    substantially conductive means substantially aligned with and spaced from a first portion of said second differential pair, said conductive means being spaced from said second differential pair by a predetermined thickness of said first means, said substantially conductive means spaced laterally a predetermined distance from said first differential pair; and
    conductive pathway means from said first substantially conductive means to said first conductor configured to increase capacitive coupling between said first conductor and said second differential pair.

12. Apparatus as claimed in claim 11 wherein said substantially conductive means is formed on said first major surface of said first means.

13. Apparatus as claimed in claim 11 wherein at least one of said substantially conductive means and said third and fourth conductors is formed as an interior layer of said first means.

14. Apparatus as claimed in claim 11 wherein said conductive pathway means includes at least a first via means extending through at least a portion of said thickness of said first means.

15. Apparatus as claimed in claim 11 wherein said first, second, third and fourth conductors are connected to pins of a cable coupler means.

* * * * *